(12) United States Patent
Mladenovic et al.

(10) Patent No.: US 12,288,967 B2
(45) Date of Patent: Apr. 29, 2025

(54) METHOD FOR DETERMINING THE STATE OF AN ELECTRICAL SWITCHGEAR ASSEMBLY, MONITORING UNIT FOR AN ELECTRICAL SWITCHGEAR ASSEMBLY, AND ELECTRICAL SWITCHGEAR ASSEMBLY

(71) Applicant: Siemens Aktiengesellschaft, Munich (DE)

(72) Inventors: Ivana Mladenovic, Seukendorf (DE); Anne Bauer, Röthenbach a.d. Pegnitz (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 177 days.

(21) Appl. No.: 18/006,781

(22) PCT Filed: Jun. 28, 2021

(86) PCT No.: PCT/EP2021/067665
§ 371 (c)(1),
(2) Date: Jan. 25, 2023

(87) PCT Pub. No.: WO2022/022923
PCT Pub. Date: Feb. 3, 2022

(65) Prior Publication Data
US 2023/0268723 A1    Aug. 24, 2023

(30) Foreign Application Priority Data
Jul. 30, 2020    (DE) ..................... 10 2020 209 645.7

(51) Int. Cl.
*H02B 13/025*    (2006.01)
*G01R 31/12*    (2020.01)
(Continued)

(52) U.S. Cl.
CPC ....... *H02B 13/025* (2013.01); *G01R 31/3275* (2013.01); *H02B 1/24* (2013.01); *G01R 31/1254* (2013.01)

(58) Field of Classification Search
CPC .... H01H 1/0015; H01H 33/66; H01H 33/563; H01H 2071/044; H02B 13/025;
(Continued)

(56) References Cited

U.S. PATENT DOCUMENTS 3,925,722 A * 12/1975 Fohrhaltz ............. G01R 27/205
324/415
4,670,812 A    6/1987 Doerfler ........................ 361/83
(Continued)

FOREIGN PATENT DOCUMENTS

DE        102 04 849        8/2002    ............. H02J 13/00
DE    10 2013 219 243        1/2018    ............. G01R 31/27
(Continued)

OTHER PUBLICATIONS

Search Report for International Application No. PCT/EP2021/067665, 13 pages, Oct. 1, 2021.
(Continued)

*Primary Examiner* — William A Bolton
(74) *Attorney, Agent, or Firm* — Slayden Grubert Beard PLLC

(57) ABSTRACT

Various embodiments of the teachings herein include methods for determining the state of an electrical switchgear assembly. The method may include: measuring an electric current and a voltage dropped across the switchgear assembly; ascertaining a time interval of an arc occurring during a switching operation; comparing the ascertained time interval to a reference value specific to the switchgear assembly; measuring a voltage profile during the time interval; and comparing the voltage profile with a reference voltage
(Continued)

profile. The time interval begins when the value of the measured voltage exceeds a first threshold value. The time interval ends when the value of the current intensity falls below a second threshold value.

13 Claims, 2 Drawing Sheets

(51) Int. Cl.
*G01R 31/327* (2006.01)
*H02B 1/24* (2006.01)

(58) Field of Classification Search
CPC .... H02B 13/065; H02B 1/24; G01R 31/3275; G01R 31/3274; G01R 31/1254; G01R 31/327; G01R 31/74; G01R 19/00
USPC .......................................... 218/155, 122, 123
See application file for complete search history.

(56) References Cited

U.S. PATENT DOCUMENTS

| | | | | |
|---|---|---|---|---|
| 5,859,596 | A | 1/1999 | McRae | 340/870.02 |
| 6,231,227 | B1* | 5/2001 | Andersen | H01H 1/0015 |
| | | | | 324/424 |
| 7,109,720 | B2* | 9/2006 | Baurand | H01H 1/0015 |
| | | | | 324/423 |
| 7,123,461 | B2* | 10/2006 | Wimmer | H01H 1/0015 |
| | | | | 361/93.6 |
| 8,000,933 | B1* | 8/2011 | Poeltl | H01H 47/002 |
| | | | | 702/182 |
| 10,533,978 | B2* | 1/2020 | Benke | G01N 29/46 |
| 2001/0019573 | A1 | 9/2001 | Dougherty | 374/4 |
| 2012/0253695 | A1 | 10/2012 | Schrag | 702/34 |
| 2015/0325394 | A1* | 11/2015 | Kovacich | H01H 33/66207 |
| | | | | 73/25.05 |
| 2016/0231381 | A1 | 8/2016 | Salziger | G01R 31/327 |
| 2018/0083434 | A1* | 3/2018 | Lim | H01H 71/04 |
| 2020/0194191 | A1* | 6/2020 | Ashtekar | G01R 31/3333 |
| 2020/0203088 | A1* | 6/2020 | Marinkovic | H01H 3/30 |

FOREIGN PATENT DOCUMENTS

| | | | | |
|---|---|---|---|---|
| DE | 10 2018 108 102 | | 10/2019 | ............. F02N 11/00 |
| EP | 0 147 592 | | 7/1985 | ............... H02H 7/22 |
| EP | 2 328 159 | | 6/2011 | ............. H01H 33/66 |
| WO | 2011 064064 | | 6/2011 | ............... H01H 1/00 |

OTHER PUBLICATIONS

Stokes A.D. et al: "Circuit-Breaker Diagnostics"; ULSI Science and Technology 1987. Philadelphia; May 11-15, 1987; [Proceedings of the International Symposium on Ultra Large Scale Integration Science and Technology]; Pennington; Electrochemical Society; US; vol. SYMP. 1; No.; pp. 1-08; XP000042544, Aug. 28, 1988.
Office Action for DE Patent Application No. 10 2020 209 645.7, 7 pages, Mar. 31, 2021.

* cited by examiner

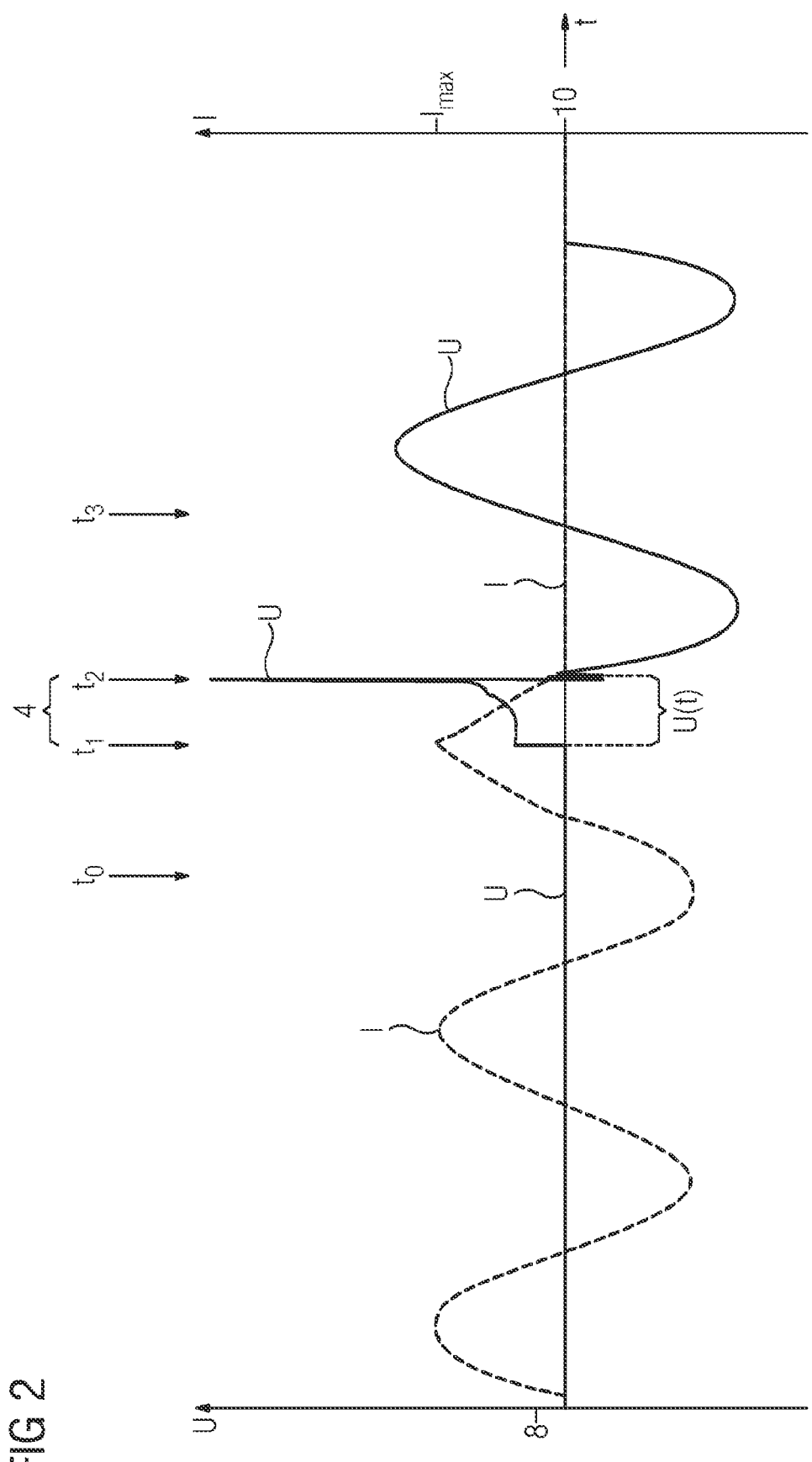

METHOD FOR DETERMINING THE STATE OF AN ELECTRICAL SWITCHGEAR ASSEMBLY, MONITORING UNIT FOR AN ELECTRICAL SWITCHGEAR ASSEMBLY, AND ELECTRICAL SWITCHGEAR ASSEMBLY

CROSS-REFERENCE TO RELATED APPLICATIONS

This application is a U.S. National Stage Application of International Application No. PCT/EP2021/067665 filed Jun. 28, 2021, which designates the United States of America, and claims priority to DE Application No. 10 2020 209 645.7 filed Jul. 30, 2020, the contents of which are hereby incorporated by reference in their entirety.

TECHNICAL FIELD

The present disclosure relates to electrical switchgear. Various embodiments include methods for determining the state of an electrical switchgear assembly, monitoring units for an electrical switchgear assembly, and/or electrical switchgear assemblies.

BACKGROUND

Switching devices or switchgear assemblies, for example air- or gas-insulated switches with vacuum interrupters or mechanical switching devices, can be found in numerous electrotechnical assemblies, in particular in the medium-voltage range or in the high-voltage range. By way of example, said switching devices or switchgear assemblies are used to protect people and assemblies, and are preferably used to deactivate network regions that are affected in the event of a fault, in particular in the event of a short circuit, for example. The switching devices age over the course of the operating duration, caused by switching operations.

By way of example, the contacts are worn down in this case, in particular as a result of the energy introduced by the arc. The operators of switchgear assemblies seek to use the switching devices in their assemblies for as long as possible without compromising the reliability. It is therefore worthwhile to know the state of health of a switching device or of a switchgear assembly as precisely as possible and to obtain a prediction of the service life still available. This allows the operator to carry out a timely exchange, without having to exchange a device far too early.

There are various procedures for estimating the service life. The data sheets of switchgear assemblies typically specify the amount of switching cycles for which a switchgear assembly is configured, depending on the switched current. On the basis of the history, that is to say the number of switching operations and the knowledge of the deactivated current intensity, the number of switching cycles still remaining can be estimated depending on the current. The time duration of the arc is not taken into consideration here, however, which plays an important role in determining the remaining service life, since the wearing of the contacts and other components can take place to a greater or lesser extent as a result. When using this method, in order to ensure a reliable switching profile, a safety buffer for surplus switching cycles has to be observed and the assembly may need to be replaced earlier.

Another procedure is to determine the energy that acts on a switching device during the switching operations. This energy is determined from the temporal profile during the switching operation by integrating the current intensity, which is known by the term $I^2t$ method. The value is added up for the switching operations that have already taken place. Depending on the switch type, there is a certain limit for the maximum total energy. Alternatively, the amount of charge Q transferred by the arc can also be determined. Both methods however have the requirement that accurate knowledge of the arc time is necessary for the calculation thereof.

SUMMARY

The teachings of the present disclosure describes methods for determining the state of an electrical switchgear assembly, monitoring units for an electrical switchgear assembly, and electrical switchgear assemblies, which can be ascertained in a more reliable manner and with less technical outlay than the prior art. As an example, some embodiments include a method for determining the state of an electrical switchgear assembly (2), wherein the electric current (I) and the voltage (U) dropped across the switchgear assembly (2) are measured, characterized in that a time interval (4) of an arc (6) occurring during a switching operation is ascertained, wherein the time interval (4) begins when the value of the measured voltage (U) exceeds a first threshold value (8) and the time interval (4) ends when the value of the current intensity (I) falls below a second threshold value (10) and the time interval (4) ascertained in this way is compared with a reference value that is specific to the switchgear assembly (2) and the voltage profile (U(t)) during the time interval (4) is measured and is compared with a reference voltage profile.

In some embodiments, the voltage (U) is measured at least every 1 MS.

In some embodiments, the current (I) is measured at least every 1 MS.

In some embodiments, the reference value defined for the switchgear assembly (2) is defined depending on the maximum current intensity ($I_{max}$) present at said switchgear assembly (2) in the closed state thereof.

In some embodiments, the reference voltage profile is ascertained depending on the maximum current intensity ($I_{max}$) present at said switchgear assembly (2) in the closed state thereof.

In some embodiments, the current intensity $I_{max}$ present at said switchgear assembly in the closed state thereof is at least 16 A.

In some embodiments, a signal (12) is generated if the time interval (4) exceeds the reference value by a limit value.

In some embodiments, the signal is generated if the time interval exceeds the reference value by 10%.

As another example, some embodiments include a monitoring unit (14) for an electrical switchgear assembly (2), comprising a measuring unit (16) for measuring the current intensity (I) flowing through the switchgear assembly and the voltage (U) dropped across the switchgear assembly (2), and comprising an evaluation unit (18) with a memory (20), characterized in that a first threshold value (8) for the present voltage (U) and a second threshold value (10) for the electric current intensity (I) are defined in the memory (20), and the evaluation unit (18) is configured to ascertain a time interval (4) that comprises the duration between the first threshold value (8) being exceeded and the second threshold value (10) being fallen below, and to compare the ascertained time interval (4) with a reference value stored in the memory (20).

In some embodiments, the evaluation unit (18) is configured to produce a signal (12) if the time interval (4) exceeds the reference value by a limit value.

In some embodiments, a communication device (22) that is configured to transmit the signal (12) to a decentralized data processing device (24) is provided.

As another example, some embodiments include an electrical switchgear assembly (2) comprising a monitoring unit (14) as described herein.

In some embodiments, the latter is configured to switch current intensities (I) of more than 16 kA.

BRIEF DESCRIPTION OF THE DRAWINGS

Further embodiments of the teachings herein and further features are explained in more detail with reference to the following figures. In the figures:

FIG. 2 shows a current-voltage graph during the deactivation of an electrical switchgear assembly, which is picked up by the evaluation unit incorporating teachings of the present disclosure.

DETAILED DESCRIPTION

Figure 1:
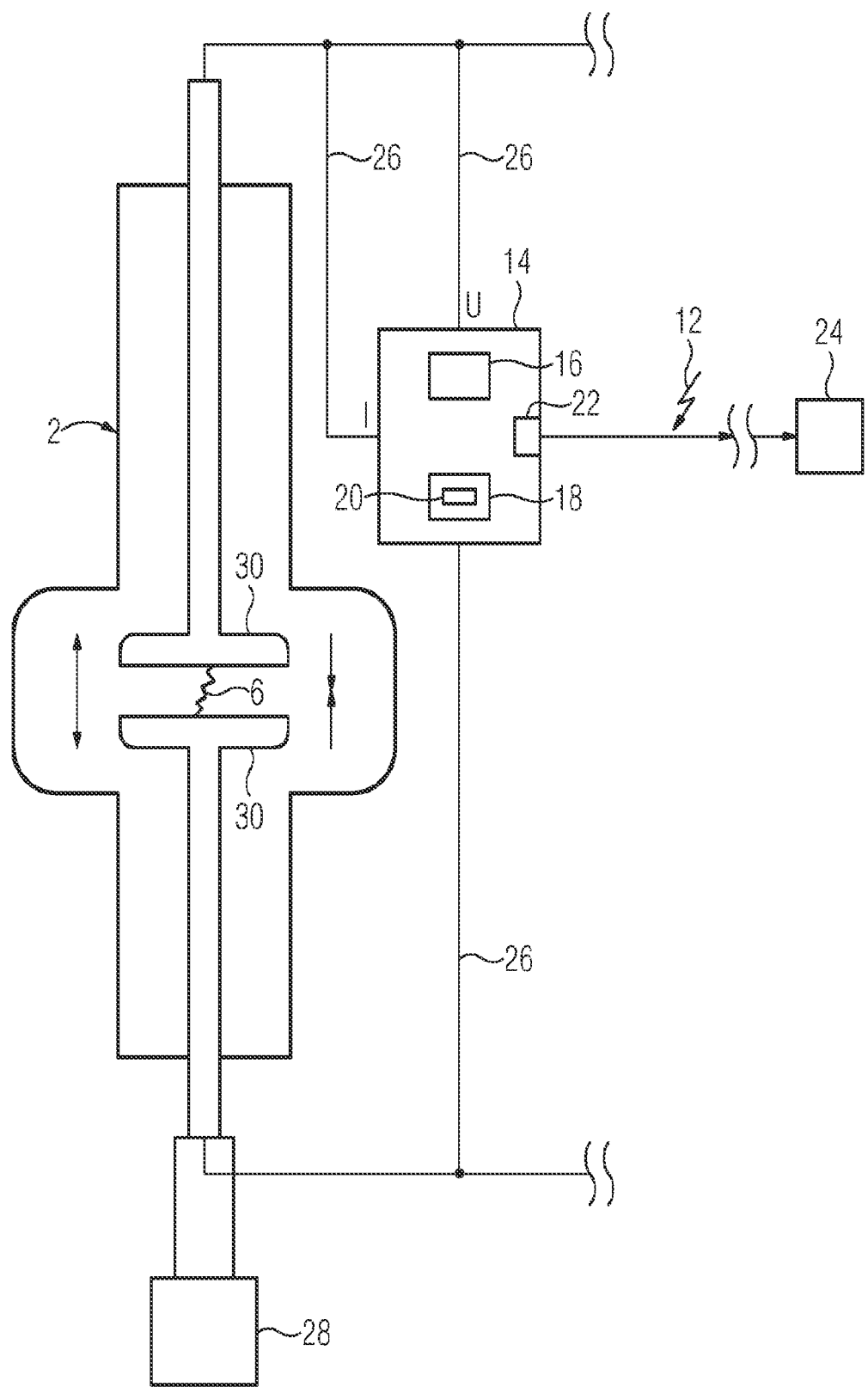
FIG. 1 shows a schematic illustration of an electrical switchgear assembly with an evaluation unit arranged thereon incorporating teachings of the present disclosure.

As an example, some embodiments of the teachings herein include a method for determining the state of an electrical switchgear assembly as follows: The electric current I and the voltage U dropped across the circuit are measured. The method is distinguished in that a time interval of an arc occurring during a switching operation is ascertained, wherein the time interval begins when the value of the measured voltage U exceeds a first threshold value, and the time interval ends when the value of the current intensity I falls below a second threshold value. The time interval ascertained in this way is compared with a reference value that is specific to the switchgear assembly.

In comparison with the prior art, the arc duration, that is to say the time interval in which the arc occurs, can be exactly defined and measured due to the two defined threshold values for the voltage, on the one hand, and for the current intensity, on the other hand. This is owing to the fact that, at the beginning of the arc, the voltage present rises extremely quickly, which is why, by way of a defined limit value, the time of the voltage rise and the beginning of the arc can be determined very exactly. On the other hand, the current drops to 0 when the arc is extinguished. Therefore, the end of the arc duration can be determined very exactly by way of the second limit value that is defined for the electric current intensity and that is generally close to 0 or exactly 0. Using these two exact values, it is possible, on the one hand, to determine the energy that is introduced into the switchgear assembly very exactly, and on the other hand, the time interval in which the arc occurs can also be determined very exactly. Using this exact time interval that is determined in the manner described, a meaningful comparison with an assembly-specific reference value can be made. This reference value is preferably the duration of the arc that is determined for an assembly in the new state. This time interval for the reference value is preferably determined using the same method as is described here.

For a switchgear assembly that is ready-for-operation and has not aged, the difference, that is to say the Δt, of the ascertained time interval and the reference value is very low. Deviations, ascertained by the assembly operator or by the manufacturer, between the measured time interval and the reference value then allow conclusions to be drawn regarding the state of health of the electrical switchgear assembly and corresponding measures can be derived.

In some embodiments, in addition to comparing the measured time interval and the reference value, a further option is determining the voltage profile during the time interval itself. This can additionally also be compared with a reference voltage profile, likewise preferably of a switchgear assembly in the new state. This comparison of the voltage profile also allows further conclusions to be drawn regarding the state of the switchgear assembly.

It should be noted here that both the pure time interval of the arc and the voltage profile are in each case dependent on the current intensity to be switched. That is to say that both the reference value for the time interval and the reference voltage profile are accordingly stored for various maximum current intensities that are present at the switchgear assembly in the closed state and accordingly have to be deactivated by disconnecting contacts of the switchgear assembly.

Both the measurement of the voltage U and the measurement of the current I should take place as continuously as possible. Since a measurement at infinitely short time intervals is not technically possible, both a current and a voltage measurement should be carried out at time intervals that are as short as possible, that is to say preferably every millisecond. The shorter the measurement intervals of these two variables, the more accurately the time interval for the arc duration can be defined, and ultimately the more accurate the comparative values with the reference value, and the conclusions about the assembly state.

The method may be used in electrical switchgear assemblies that switch relatively high current intensities, e.g. medium-voltage and high-voltage switchgear assemblies that are configured for at least 16 A. The current intensity is load-dependent, that is to say it can differ considerably at different times. $I_{max}$ can therefore be different for a plurality of switching operations.

In some embodiments, a signal is generated if the time interval exceeds the reference value by a limit value. This signal can be configured with a wide variety of forms and modes of action. By way of example, in the simplest form the signal can be conducted to a fault memory located in the assembly, and retrieved therefrom if necessary. It could also be directly forwarded to a control system of an electricity network and processed further there, however. The described limit value by which the time interval of the arc may exceed the defined reference value should, following tests on various switchgear assemblies, not exceed 10%.

In some embodiments, a monitoring unit for an electrical switchgear assembly comprises a measuring unit for measuring the current intensity flowing through the switchgear assembly and the voltage dropped across the switchgear assembly. This monitoring unit has an evaluation unit that is equipped with a memory. The monitoring unit is distinguished in that a first threshold value for the present voltage and a second threshold value for the electric current intensity are defined in the memory, and the evaluation unit is configured to ascertain a time interval that comprises the duration between the first threshold value being exceeded and the second threshold value being fallen below, in order to compare the ascertained time interval with a reference value stored in the memory.

The monitoring unit is therefore a unit may be arranged spatially close to the electrical switchgear assembly, and can be considered to be a component part of this whole unit. The monitoring unit may be configured to produce a signal if the time interval exceeds the reference value by a limit value, which in turn is may be 10% of the time interval.

A communication device that is configured to transmit the signal to a decentralized data processing device is also provided at the monitoring unit. As already described, a decentralized data processing device can be connected to a network control system, for example, as a result of which there is information regarding the state of the monitored switchgear assembly in the network control system.

As another example, some embodiments include an electrical switchgear assembly, which comprises a monitoring unit as described herein. In this case, the electrical switchgear assembly is a medium-voltage or high-voltage switchgear assembly with a configuration for at least 16 A.

FIG. 1 schematically shows an electrical switchgear assembly 2, which has two contacts 30 that can be disconnected from one another and closed again, respectively, by means of a drive 28. This is illustrated by the arrows pointing in opposite directions next to the contacts 30. A switching arc 6 occurs when there is voltage present or current flowing both when the contacts 30 are opened and when they are closed. It should be noted here that the contact shape described is depicted in a very simplified manner. This can be any technically conventional electrical switchgear assembly, such as vacuum interrupters or gas-insulated switchgear assemblies with tulip/pin contacts or, as shown here, plate contacts.

The switching arc 6 introduces a very large amount of energy locally and sporadically into the switchgear assembly 2, in particular to the contacts 30. This results in temporary and local melting of the contacts, which contributes to the aging of the contacts 30. In order to accurately determine the state of health of the electrical switchgear assembly, it is important to find out the way in which the switching arc 6 behaves during the switching-on and switching-off of the electrical switchgear assembly 2. As already described, it is usual to carry out an estimation of the state of the switchgear assembly 2 by way of the energy introduced. The electrical switchgear assembly 2 described here comprises a further evaluation unit 18, however, which is suitable for continuously ascertaining the present electric current I and the voltage U dropped across the switchgear assembly 2 via measurement feeds 26. In this case, continuously means that both the current I and the voltage U are measured as far as possible in short measurement intervals, as far as possible shorter than 1 millisecond.

FIG. 2 shows a graphical representation of the continuously measured current intensity I and the voltage U in a joint graph. In this case, the left-hand y-axis shows the voltage U dropped, the right-hand y-axis shows the current intensity I. Following the x-axis, which depicts the time t, from left to right, the sinusoidal profile of the current intensity I can be seen first, wherein the voltage curve U is close to 0, since when the contacts are closed, only a very low voltage is dropped across the switchgear assembly; in this case this is the voltage that contributes to the contact resistance, which is naturally very low. This temporal range is denoted by way of example by the arrow that is denoted by t0.

At the moment in which the switching operation begins and the two contacts 30 are disconnected from one another, the voltage U increases suddenly, which is denoted by the arrow that is denoted by t1. The switching operation is ended at the time t2, since at this moment the current curve I becomes 0. A zero crossing of the current therefore takes place, as a result of which the switching arc 6 is extinguished. The open state of the switchgear assembly then follows, in which no current is flowing at the exemplary time t3.

Between the times t1 and t2, there is a time interval 4 in which the arc 6 occurs during the switching operation.

In this case, the times t1 and t2 are defined as follows: On the one hand, there is a first threshold value 8 that defines a voltage value that, when exceeded, means that the time interval 4 begins, that is to say the time t1 is defined. It can be seen in FIG. 2 that the voltage value U increases abruptly at the time t1. The threshold value 8 is shown schematically here, clearly arranged above the 0 value of the voltage U. The time t1 can therefore be defined very accurately using the threshold value 8.

In contrast thereto, the time t2 corresponds to a second threshold value 10 that is plotted on the y-axis that represents the electric current. In this case, the second threshold value 10 can be very close to the 0 value of the electric current, directly at the 0 value, or possibly also just below it. In principle, it is possible to refer to the arc 6 being extinguished when the electric current passes through a zero crossing. Technological or metrological intricacies can mean that the threshold value 10 is not arranged exactly at the 0 point of I, but rather is defined loosely around it.

FIG. 2 also shows that the electric current intensity I adopts a sinusoidal profile in the closed state. The electric current I breaks down from the time t1, and undergoes a zero crossing at the time t2. In contrast, as already mentioned, the voltage U is close to 0 during the closed state, it increases abruptly at t1 and oscillates in a sinusoidal manner after the arc 6 has been extinguished, that is to say after the time t2, whereas the current I runs on the 0 line after t2.

In the time interval 4, that is to say between the times t1 and t2, the voltage curve adopts a profile that is completely non-uniform and has a distinct peak. This profile of the voltage curve during the time interval 4 is denoted by U(t) at this point. This voltage profile U(t) in the time interval 4 also has a characteristic formation that allows conclusions to be drawn about the state of the switchgear assembly 2. In this case, a switchgear assembly in the new state has a different U(t) profile to a switchgear assembly that has already undergone several thousand switching cycles. The profile of U(t) is also dependent on the current intensity I to be switched, which in this case is represented as $I_{max}$ and represents the maximum of the sinusoidal oscillation of the current curve in the graph in FIG. 2.

On the one hand, the method described now makes it possible to carry out an exact determination of the time interval 4 by exactly determining the times t1 and t2, and to compare these with a reference value of a switchgear assembly that is like-new. On the other hand, it is also possible to compare the characteristics of the voltage curve in the time interval 4 between t1 and t2 with a reference voltage curve, which is not depicted here, and which originates from a switchgear assembly in the new state. The comparison of the two voltage profile curves is more complex than the pure comparison of two numerical values that represent the time interval 4. It is therefore expedient to first compare the two numerical values for the time interval: the value measured at present and the value stored as reference value in a relatively simple manner, and if a limit value that has been defined in advance on the basis of empirical values is exceeded, to check whether the switchgear assembly 2 currently in operation is still in a corresponding state. By way of example, if the limit value is exceeded by 10%, that is to say if the arc duration, the time interval 4, is 10% longer than is the case for a switchgear assembly that is like-new, this could therefore indicate considerable loading of the switchgear assembly 2.

In this case, a signal is produced that is stored in an internal memory 20 of the monitoring unit 14. The difference between the measured time interval and the reference value is ascertained by means of an evaluation unit 18, which also comprises the memory 20 in the monitoring unit. To this end, a measuring unit 16 that is responsible for ascertaining the measured values of the electric current intensity I and the voltage U is also provided. Therefore, the measuring unit 16, the evaluation unit 18 and the memory 20, and possibly a communication module 22, are component parts of the monitoring unit 14, which is arranged on the electrical switchgear assembly 2.

The communication module 22 makes it possible to send a signal that comprises information regarding the difference between the time interval 4 and the reference value or else information regarding a different profile of the U(t) curve with the reference voltage profile to a decentralized data processing device 24. By way of example, this data processing device 24 can be part of a network control system, but it can also be allocated anywhere in a cloud computing center in order to forward information to a control system. These signals 12 then comprise information regarding the state of the switchgear assembly 2. As already mentioned, this information can be ascertained in a relatively simple way from the time interval 4 between t1 and t2 or, linked with a more complex evaluation, using the U(t) profile of the voltage curve during the time interval 4. In principle, this information that is ascertained therefrom and that produces the signal 12 can also be stored locally in the memory 20 and can be read by a service engineer during routine readings or maintenance of the switchgear assembly 2 or the monitoring unit 14 and transmitted to a central computer or to the central data processing device 24.

The different duration of the switching arc with aging switchgear assemblies 2, under the same conditions, that is to say with the same current intensity I that is deactivated, stems from contamination of the insulation medium. This can result in an altered duration of the arc. By way of example, the gas contaminations can occur due to the wearing of contacts during the switching operations. A similar situation also applies to the U(t) profile, that is to say the voltage profile during the time interval 4. In the new state of the switchgear assembly, the characteristic voltage profiles U(t) as a function of the time of the switching (in the current profile curve I and relative to the phase angle) and the current intensity I are known to the switch, the manufacturer of the switchgear assembly, since this is relevant to the switch design. Deviations from the characteristic voltage curve, that is to say from the reference voltage profile, indicate a deterioration of the state of the switchgear assembly 2. By way of example, this is manifested in contact deterioration if the voltage increase at the beginning of the arc 6 is very steep. A deterioration of the state of the switchgear assembly also results in the deterioration of the insulating gas if the voltage is high for a long time, i.e. there is a wide peak, at the beginning of the arc.

LIST OF REFERENCE SIGNS

2 Electrical switchgear assembly
4 Time interval
6 Arc
8 First threshold value
10 Second threshold value
12 Signal
14 Monitoring unit
16 Measuring unit
18 Evaluation unit
20 Memory
22 Communication device
24 Decentralized data processing device
26 Measurement feeds
28 Drive
30 Contacts
$t_0$ Voltage/current profile of the closed state
$t_1$ Beginning of the time interval
$t_2$ End of the time interval
$t_3$ U/I profile of the open state

What is claimed is:

1. A method for determining a state of an electrical switchgear assembly, the method comprising:
   measuring an electric current and a voltage dropped across the switchgear assembly;
   ascertaining a time interval of an arc occurring during a switching operation;
   wherein the time interval begins when the measured voltage exceeds a first threshold value;
   wherein the time interval ends when the current intensity falls below a second threshold value;
   comparing the ascertained time interval to a reference value specific to the switchgear assembly;
   measuring a voltage profile during the time interval; and
   comparing the voltage profile with a reference voltage profile.

2. The method as claimed in claim 1, wherein the voltage is measured at least every 1 ms.

3. The method as claimed in claim 1, wherein the current is measured at least every 1 ms.

4. The method as claimed in claim 1, wherein the reference value defined for the switchgear assembly depends on a maximum current intensity present at said switchgear assembly in a closed state thereof.

5. The method as claimed in claim 1, wherein the reference voltage profile is ascertained depending on a maximum current intensity present at said switchgear assembly in a closed state thereof.

6. The method as claimed in claim 1, wherein the current intensity present at said switchgear assembly in a closed state thereof is at least 16 A.

7. The method as claimed in claim 1, further comprising generating a signal if the time interval exceeds the reference value by a limit value.

8. The method as claimed in claim 7, wherein the signal is generated if the time interval exceeds the reference value by 10%.

9. A monitoring unit for an electrical switchgear assembly, the monitoring unit comprising:
   a measuring unit for measuring a current intensity flowing through the switchgear assembly and a voltage dropped across the switchgear assembly; and
   an evaluation unit with a memory;
   wherein the memory stores a first threshold value for the voltage and a second threshold value for a electric current intensity; and
   the evaluation unit is programmed to ascertain a time interval indicating a duration between the first threshold value being exceeded and the second threshold value being fallen below, and to compare the ascertained time interval with a reference value stored in the memory.

10. The monitoring unit as claimed in claim 9, wherein the evaluation unit is configured to produce a signal if the time interval exceeds the reference value by a limit value.

11. The monitoring unit as claimed in claim 10, further comprising a communication device configured to transmit the signal to a decentralized data processing device.

12. An electrical switchgear assembly comprising:
  a measuring unit for measuring a current intensity flowing through the switchgear assembly and a voltage dropped across the switchgear assembly; and
  an evaluation unit with a memory;
  wherein the memory stores a first threshold value for the voltage and a second threshold value for the current intensity; and
  the evaluation unit is programmed to ascertain a time interval indicating a duration between the first threshold value being exceeded and the second threshold value being fallen below, and to compare the ascertained time interval with a reference value stored in the memory.

13. The electrical switchgear assembly as claimed in claim 12, configured to switch current intensities of more than 16 kA.

* * * * *